United States Patent [19]

Hashimoto et al.

[11] Patent Number: 5,309,115
[45] Date of Patent: May 3, 1994

[54] BURST CONTROL CIRCUIT FOR USE IN TDMA COMMUNICATIONS SYSTEM

[75] Inventors: Kazuya Hashimoto; Daiji Horikoshi, both of Tokyo, Japan

[73] Assignee: NEC Corporation, Tokyo, Japan

[21] Appl. No.: 960,865

[22] Filed: Oct. 14, 1992

[30] Foreign Application Priority Data

Oct. 14, 1991 [JP] Japan .................................. 3-293736

[51] Int. Cl.⁵ ............................................. H03G 3/20
[52] U.S. Cl. ..................................... 330/133; 330/134; 330/279; 455/116; 455/126; 455/127
[58] Field of Search ................ 330/129, 133, 134, 137, 330/138, 279, 285; 455/116, 126, 127; 375/60, 68, 70, 71, 98

[56] References Cited

U.S. PATENT DOCUMENTS 5,101,176  3/1992  Norimatsu .......................... 330/279
5,194,823  3/1993  Wendt et al. .................... 330/279 X Primary Examiner—James B. Mullins
Attorney, Agent, or Firm—Sughrue, Mion, Zinn, Macpeak & Seas

[57] ABSTRACT

A burst control circuit for use in a TDMA communications system comprises a power amplifier having two separate control terminals. A level control signal which is the difference between a reference signal and the level of the output burst signal of the amplifier, feedback-controls the level of the output burst signal through a first control terminal, and a waveform control signal having a predetermined waveform, controls the waveform of the output burst signal through a second control terminal. When the level of the reference signal is decreased, the amplitude of the waveform control signal is decreased as a function of the level of the reference signal.

7 Claims, 1 Drawing Sheet

BURST CONTROL CIRCUIT FOR USE IN TDMA COMMUNICATIONS SYSTEM

BACKGROUND OF THE INVENTION

This invention relates to a burst control circuit for use in a time division multiple access (TDMA) communications system.

One of the prior arts of this invention is disclosed in U.S. Pat. No. 5,101,176 entitled "BURST CONTROL CIRCUIT FOR USE IN TDMA COMMUNICATIONS SYSTEM" which is assigned to the same assignee as the present application, and which will hereafter be called the prior circuit.

In the prior circuit, a power amplifier having two control terminals amplifies an input radio signal to produce an output burst signal. A level control signal representing a difference between a reference signal and the level of the output burst signal, feedback-controls the level of the output burst signal through a first control terminal of the amplifier. A waveform control signal of a fixed amplitude controls the waveform of the output burst signal through a second control terminal of the amplifier.

The waveform control signal has a trapezoidal waveform and the rise and fall times of the waveform control signal are so determined that the spectrum bandwidth of the output burst signal is suppressed within an allowable range.

A non-linear power amplifier having a high power efficiency is used as the power amplifier of the prior circuit. In a small power output range of this non-linear power amplifier, a small increment of the level control signal causes an excessively large increment of the output burst signal.

This characteristic of the power amplifier makes it difficult to carry out a fine level control in a small power output range. And this excessively high gain of the amplifier in a small power range often deteriorates the stability of the feedback-control, resulting in overshoots in the leading and trailing edges of the waveform.

BRIEF DESCRIPTION OF THE INVENTION

Therefore, a primary object of the present invention is to provide a burst control circuit which can control a same amplifier as used in the prior circuit, with a required precision and a sufficient stability for all the ranges of the output.

For this object, the amplitude of the waveform control signal is changed as a function of the amplitude of the reference signal.

When a controlled output of the power amplifier is small, the amplitude of the reference signal is set at a low level, and the amplitude of the waveform control signal becomes small. The small amplitude of the waveform control signal suppresses the gain of the power amplifier in a small power output range and makes the control by the level control signal easier.

According to the present invention, there is provided a burst control circuit for use in a TDMA communications system, comprising: power amplifier means having first and second control terminals for amplifying an input radio signal to produce an output burst signal, the amplifier means changing the level and waveform of the output burst signal in response to level and waveform control signals which are supplied through the first and the second control terminals, respectively; ALC- (automatic level control) circuit means for generating a level control signal on the basis of a signal representing a difference between a reference signal and the level of the output burst signal, and supplying the generated level control signal to the first control terminal as the level control signal; and waveform control circuit means for generating a waveform control signal having a predetermined waveform and an amplitude which is a function of the amplitude of the reference signal, and supplying the generated waveform control signal to the second control terminal as the waveform control signal.

BRIEF DESCRIPTION OF THE DRAWINGS

Further objects, features, and advantages of this invention will become apparent from a consideration of the following description, the appended claims, and the accompanying drawings.

DETAILED DESCRIPTION OF THE PREFERRED EMBODIMENTS

Figure 1:
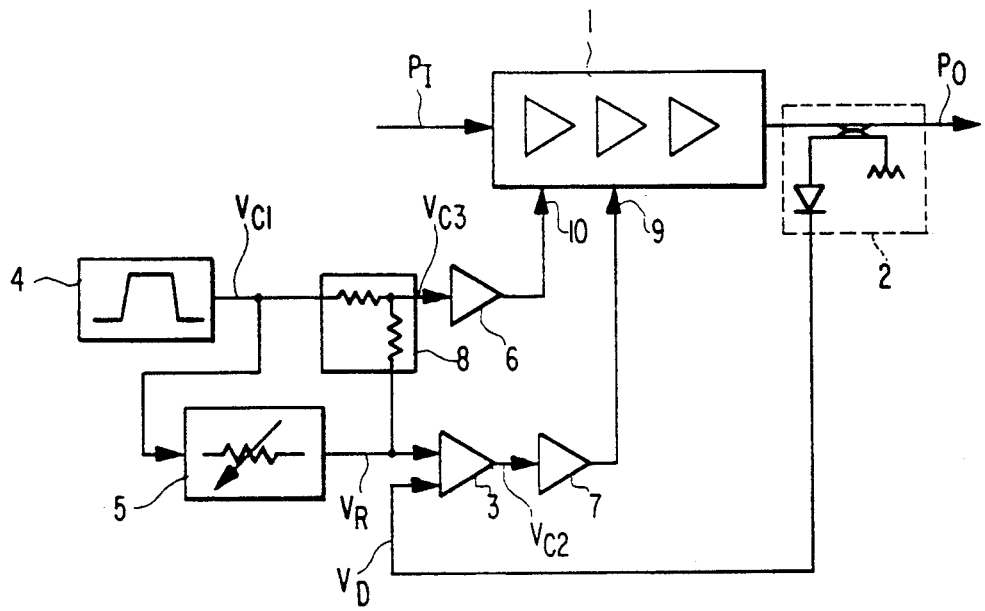
FIG. 1 is a block diagram illustrating an embodiment of the present invention.

In FIG. 1, a power amplifier 1, having a high power efficiency, amplifies an input radio signal $P_I$ to produce an output burst signal $P_O$. A detector 2 including a directional coupler detects the output burst signal $P_O$ and produces a voltage $V_D$ representing the level of the output burst signal $P_O$.

A trapezoidal wave generator 4 generates a trapezoidal wave signal for modulating the waveform of the output burst signal $P_O$. The trapezoidal wave signal has gently slopped leading and trailing edges. The input radio signal $P_I$ may be a continuous signal or a burst signal, and when $P_I$ is a burst signal, the trapezoidal wave signal $V_{C1}$ must be synchronized with the input burst signal.

The output $V_{C1}$ of the trapezoidal wave generator 4 is attenuated by a variable attenuator 5 to produce a variable reference signal $V_R$. A differential amplifier 3 produces an error signal $V_{C2}$ which is proportional to $(V_R - V_D)$. The error signal or the level control signal $V_{C2}$ feedback-controls the level of the output burst signal $P_O$ through another current booster 7 and a first control terminal 9 of the power amplifier 1. Thus, the power amplifier 1, the detector 2, the differential amplifier 3, the current booster 7, and the control terminal 9 constitute an ALC circuit. The circuit elements, except for elements 5, 6 and 8, are explained in detail in the above-mentioned U.S. Pat. No. 5,101,175, the disclosure of which is hereby incorporated by reference.

A voltage synthesizer 8 produces a waveform control signal $V_{C3}$ having an amplitude which is a function of the amplitude of the reference signal $V_R$.

The waveform control signal $V_{C3}$ modulates the amplitude of $P_O$ through a current booster 6 and a second control terminal 10 of the power amplifier 1.

The attenuator 5 and voltage synthesizer 8 are the feature elements of the present invention and play very important roles as described in detail below.

Figure 2:
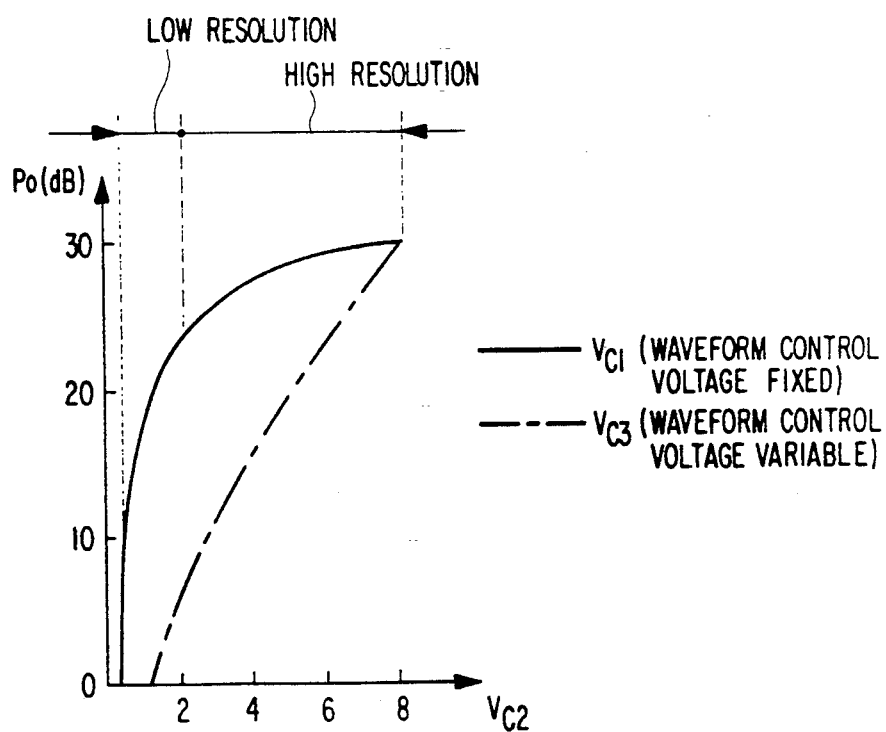
FIG. 2 shows an input to output characteristic of an embodiment shown in FIG. 1.

Referring also to FIG. 2, a solid line illustrates an input to output characteristic of the prior circuit, and a chain line illustrates an input to output characteristic of the circuit shown in FIG. 1.

For the sake of comparison, the solid line in FIG. 2 is explained in the first place. The block diagram of the prior circuit will be represented by FIG. 1, when the voltage synthesizer 8 is eliminated and the trapezoidal wave signal $V_{C1}$ of a fixed amplitude is directly connected to the input of the current booster 6. Thus the level control of the prior circuit depends entirely on the error signal $V_{C2}$.

The open loop characteristic of $V_{C2}$ to $P_O$ ($P_O$ is measured by dB scale) of the power amplifier 1 is as shown by the solid line in FIG. 2.

As $dP_O/dV_{C2}$ is very large in a small power range, a fine control of the output power $P_O$ is very difficult in this range.

Returning to FIG. 1, and assuming that the attenuator 5 is set at a point where $$V_R = nV_{C1} \tag{1}$$

that the resistance between $V_{C1}$ and $V_{C3}$ is R, and that the resistance between $V_R$ and $V_{C3}$ is mR, we obtain $$(V_{C3}/V_{C1}) = (n+m)/(1+m) = A \tag{2}$$

This value of A is an extra attenuation caused by using the waveform control signal $V_{C3}$ instead of $V_{C1}$.

$$\alpha = 20 \log A \tag{3}$$

represents the extra attenuation in dB scale. In FIG. 2, when $V_{C2} = 8$ V corresponds to n=1, $V_{C2} = 4$ V corresponds to n=0.5.

We can select an appropriate value for m and calculate the values of $\alpha$ for the values of $V_{C2}$ by equations (2) and (3). Subtracting these values of $\alpha$ from the solid line in FIG. 2 at corresponding points of $V_{C2}$, we obtain the chain line in FIG. 2.

Therefore, the chain line in FIG. 2 illustrates the control characteristic of $V_{C2}$ when there is the extra attenuation $\alpha$.

It is apparent that the control characteristic of the chain line is substantially improved in a low power range compared with that of the solid line. As a result, the burst control circuit according to the present invention has a substantially equal, and a considerably high resolution over all the ranges of the output power $P_O$. Thus it is easy to finely control the output power $P_O$ over all the ranges of same.

In the embodiment shown in FIG. 1, the waveform control signal $V_{C3}$ is synthesized by the voltage synthesizer 8. It must be noted, however, that there are many different means for generating a waveform control signal having an amplitude which is a function of the amplitude of the reference signal, and that any of these means is applicable to this invention.

We claim:

1. A burst control circuit for use in a TDMA communications system comprising:
    power amplifier means having first and second control terminals for amplifying an input radio signal to produce an output burst signal, said amplifier means changing the level and waveform of said output burst signal in response to level and waveform control signals which are supplied through said first and second control terminals, respectively;
    ALC circuit means for generating a level control signal on the basis of a signal representing a difference between the level of a reference signal and the level of said output burst signal, and supplying the generated level control signal to said first control terminal as said level control signal; and
    waveform control circuit means for generating a waveform control signal having a predetermined waveform and an amplitude which is a function of the amplitude of said reference signal, and supplying the generated waveform control signal to said second control terminal as said waveform control signal.

2. A burst control circuit as claimed in claim 1, wherein said reference voltage is obtained from a trapezoidal wave generator through a variable attenuator, said trapezoidal wave generator generating a signal having said predetermined waveform.

3. A burst control circuit as claimed in claim 2, wherein said waveform control signal is synthesized by a voltage synthesizer from said reference signal and the output signal of said trapezoidal wave generator.

4. A burst control circuit as claimed in claim 1, wherein the level of said output burst signal is detected by a detector which detects the output of a directional coupler coupled to said output burst signal.

5. A burst control circuit as claimed in claim 4, wherein said level control signal is produced by a differential amplifier which amplifies the difference between said reference signal and the output of said detector.

6. A method of controlling a burst signal, comprising the steps of:
    generating a level control signal on the basis of a signal representing a difference between the level of a reference signal and the level of an output burst signal;
    generating a waveform control signal having a predetermined waveform and an amplitude which is a function of the amplitude of said reference signal; and
    amplifying an input radio signal to produce said output burst signal in accordance with said level and waveform control signals.

7. A method as claimed in claim 6, wherein said step of generating a waveform control signal comprises the steps of:
    generating an original signal having gently sloped leading and trailing edges;
    attenuating the amplitude of said original signal to produce attenuated signal as said reference signal; and
    combining said original signal and said attenuated signal to produce a combined signal as said waveform control signal.

* * * * *